(12) United States Patent
Miller et al.

(10) Patent No.: US 10,711,693 B2
(45) Date of Patent: Jul. 14, 2020

(54) GAS TURBINE ENGINE WITH AN ENGINE ROTOR ELEMENT TURNING DEVICE

(71) Applicant: General Electric Company, Schenectady, NY (US)

(72) Inventors: Brandon Wayne Miller, Liberty Township, OH (US); Raymond Floyd Martell, Wyoming, OH (US); Mark Leonard Hopper, West Chester, OH (US); Scott Douglas Waun, Loveland, OH (US)

(73) Assignee: General Electric Company, Schenectady, NY (US)

( * ) Notice: Subject to any disclaimer, the term of this patent is extended or adjusted under 35 U.S.C. 154(b) by 264 days.

(21) Appl. No.: 15/647,380

(22) Filed: Jul. 12, 2017

(65) Prior Publication Data
US 2019/0017438 A1    Jan. 17, 2019

(51) Int. Cl.
| | |
|---|---|
| *F02C 6/18* | (2006.01) |
| *F02C 7/36* | (2006.01) |
| *F02C 3/04* | (2006.01) |
| *F02C 7/32* | (2006.01) |
| *F01D 15/10* | (2006.01) |
| *F01D 25/36* | (2006.01) |
| *H01L 35/30* | (2006.01) |

(52) U.S. Cl.
CPC ............. *F02C 6/18* (2013.01); *F01D 15/10* (2013.01); *F01D 25/36* (2013.01); *F02C 3/04* (2013.01); *F02C 7/32* (2013.01); *F02C 7/36* (2013.01); *H01L 35/30* (2013.01); *F05D 2260/4031* (2013.01)

(58) Field of Classification Search
CPC ...... F02C 6/18; F02C 3/04; F02C 7/36; F01D 15/10; F01D 25/36
See application file for complete search history.

(56) References Cited

U.S. PATENT DOCUMENTS

| | | |
|---|---|---|
| 5,832,714 A | 11/1998 | Hines |
| 6,227,153 B1 | 5/2001 | Till |
| (Continued) | | |

FOREIGN PATENT DOCUMENTS

| | | |
|---|---|---|
| DE | 1 476 854 A1 | 10/1969 |
| EP | 174625723 | 1/2007 |
| (Continued) | | |

OTHER PUBLICATIONS

Extended European Search Report and Opinion issued in connection with corresponding EP Application No. 18180941.9 dated Jan. 14, 2019.

(Continued)

*Primary Examiner* — Craig Kim
(74) *Attorney, Agent, or Firm* — McGarry Bair PC

(57) ABSTRACT

A turbine engine has a core with a compressor, combustor, and turbine sections in axial flow arrangement and with corresponding rotating elements mounted to a shaft defining engine rotor elements. The turbine engine has a rotary driver operably coupled to the engine rotor elements. The turbine engine has at least one thermoelectric generator in thermal communication with the core and in electrical communication with the rotary driver to provide power to the rotary driver to turn the engine rotor elements.

20 Claims, 5 Drawing Sheets

(56) References Cited

U.S. PATENT DOCUMENTS

| | | |
|---|---|---|
| 6,742,339 B2 | 6/2004 | Horner |
| 7,168,918 B2 | 1/2007 | Balan et al. |
| 7,493,769 B2 | 2/2009 | Jangili |
| 7,802,757 B2 | 9/2010 | Dooley et al. |
| 8,484,983 B2 | 7/2013 | Gao et al. |
| 8,549,861 B2 | 10/2013 | Huffman |
| 8,578,696 B2 * | 11/2013 | Sundaram ............... F01D 25/30 60/39.5 |
| 8,776,530 B2 | 7/2014 | Shirooni et al. |
| 8,944,367 B2 | 2/2015 | Bystry, Jr. et al. |
| 9,303,549 B2 | 4/2016 | Chellan et al. |
| 9,388,740 B2 | 7/2016 | Kwok et al. |
| 9,447,795 B2 | 9/2016 | Allan |
| 2004/0045594 A1 * | 3/2004 | Hightower ............... F02C 6/18 136/205 |
| 2011/0108080 A1 | 5/2011 | Kwok et al. |
| 2013/0205798 A1 * | 8/2013 | Kwok ....................... F02K 1/00 60/783 |
| 2015/0330303 A1 | 11/2015 | Delgado, Jr. et al. |
| 2015/0372214 A1 * | 12/2015 | Kim ......................... F02C 6/18 136/205 |
| 2016/0075438 A1 | 3/2016 | Akin |
| 2017/0005250 A1 | 1/2017 | Hiller |
| 2017/0044989 A1 | 2/2017 | Gemin et al. |
| 2017/0234166 A1 * | 8/2017 | Dube ....................... F02C 3/04 60/779 |
| 2017/0356470 A1 * | 12/2017 | Jaffrey .................... F04F 13/00 |

FOREIGN PATENT DOCUMENTS

| | | |
|---|---|---|
| EP | 2 554 799 A2 | 2/2013 |
| EP | 3 173 608 A1 | 5/2017 |
| JP | 2001263088 A2 | 9/2001 |
| JP | 2004140202 A | 5/2004 |
| JP | 2009516793 A | 4/2009 |
| JP | 2017048784 A | 3/2017 |
| WO | 201012824123 | 11/2010 |

OTHER PUBLICATIONS

European Patent Office, Communication Pursuant to Article 94(3) EPC re Application No. 18180941.9-1006, dated Dec. 13, 2019, 4 pages, Munich, Germany.

JP2017048784A, U.S. Patent Publication No. 2017/0044989 A1.

JP2009516793A, U.S. Pat. No. 7,802,757 B2.

Japanese Patent Office, First Office Action re Japanese Patent Application No. 2018-129606, dated Sep. 3, 2019, 5 pages, Japan.

* cited by examiner

GAS TURBINE ENGINE WITH AN ENGINE ROTOR ELEMENT TURNING DEVICE

BACKGROUND OF THE INVENTION

Turbine engines, and particularly gas or combustion turbine engines, are rotary engines that extract energy from a flow of combusted gases passing through the engine onto a multitude of rotating turbine elements or blades, and in some cases, such as aircraft, generate thrust for propulsion.

Gas turbine engines for aircraft are designed to operate at high temperatures to maximize engine efficiency, so cooling of certain engine components, such as a high pressure turbine and a low pressure turbine and associated rotor elements, can be beneficial. Typically, cooling is accomplished by ducting cooler air from high and/or low pressure compressors to the engine components that require cooling. Temperatures in the high pressure turbine can be 1000° C. to 2000° C. and the cooling air from the compressor can be 500° C. to 700° C., enough of a difference to cool the high pressure turbine.

BRIEF DESCRIPTION OF THE INVENTION

In one aspect, the disclosure relates to a turbine engine. The turbine engine has a core with a compressor, combustor, and turbine in axial and/or centrifugal flow arrangement and with corresponding rotating elements mounted to a shaft that defines engine rotor elements. The turbine engine has a rotary driver operably coupled to the engine rotor elements. The turbine engine has at least one thermoelectric generator in thermal communication with the core and in electrical communication with the rotary driver to provide power to the rotary driver to turn the engine rotor elements.

In another aspect, the disclosure relates to a turbine engine rotation device. The turbine rotation device has a rotary driver operably coupled to and turning engine rotor elements on the turbine engine. The device also has a thermoelectric generator positioned above at least a portion of a heat source on the turbine engine and in electrical communication with the rotary driver to provide power to the rotary driver and turn the engine rotor elements.

In yet another aspect, the disclosure relates to a method of turning the rotor of a turbine engine with a rotary driver, the method comprising converting heat from the engine into electricity and supplying the electricity to the rotary driver to power the rotary driver to turn the engine rotor elements.

DETAILED DESCRIPTION OF THE INVENTION

Figure 1:
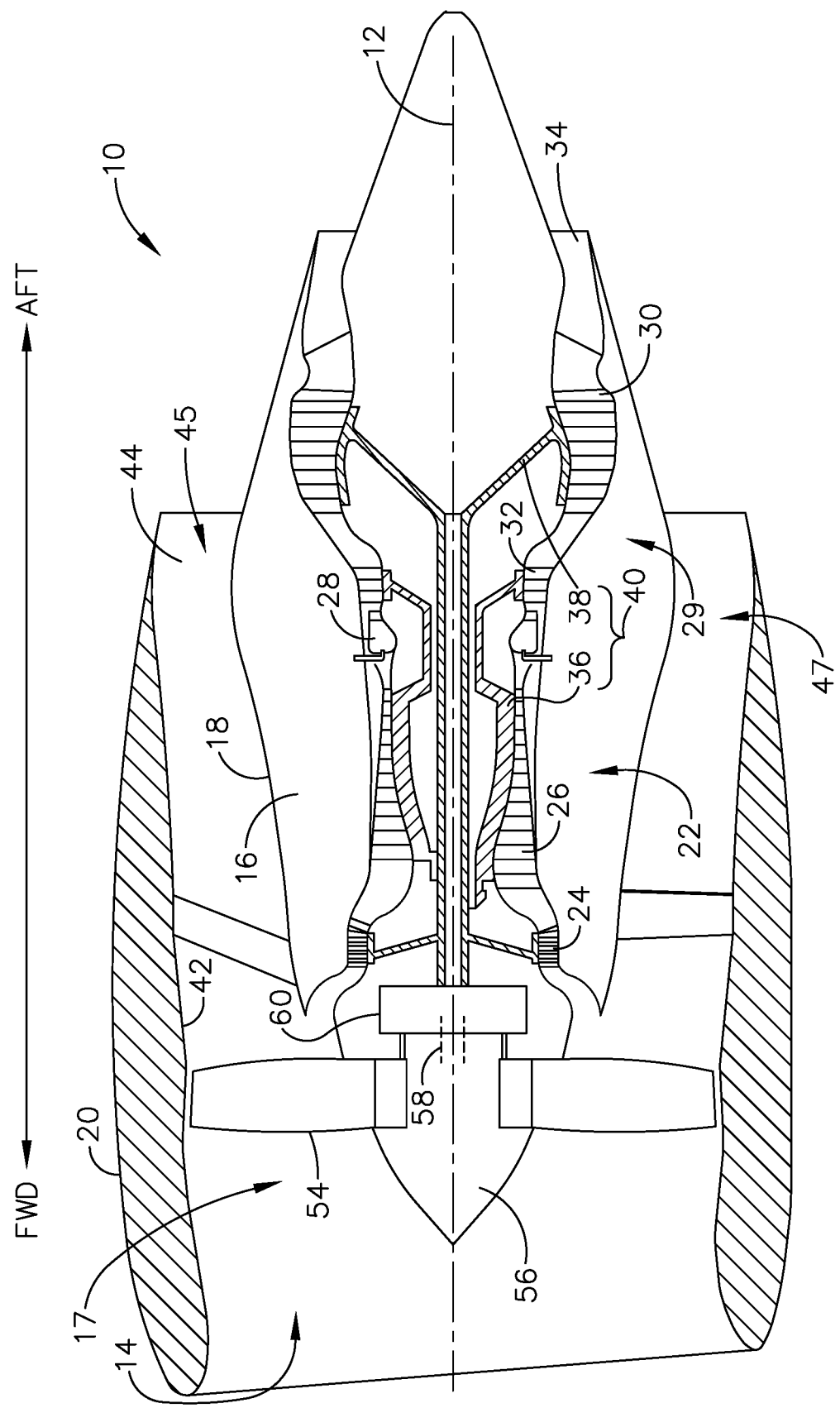
FIG. 1 is a schematic cross-sectional diagram of a portion of a turbine engine for an aircraft.

As used herein, the term "forward" or "upstream" refers to moving in a direction toward the engine inlet, or a component being relatively closer to the engine inlet as compared to another component. The term "aft" or "downstream" used in conjunction with "forward" or "upstream" refers to a direction toward the rear or outlet of the engine or being relatively closer to the engine outlet as compared to another component.

Additionally, as used herein, the terms "radial" or "radially" refer to a dimension extending between a center longitudinal axis of the engine and an outer engine circumference. A "set" as used herein can include any number of a particular element, including only one.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 is a schematic cross-sectional diagram of a portion of a turbine engine 10 for an aircraft. The turbine engine 10 has a longitudinally extending axis or centerline 12 extending from forward (FWD) to aft (AFT). A flow path 14 can be defined along the centerline 12. A turbine engine core 16, a fan assembly 17, and a nacelle 20 can be included in the turbine engine 10. The turbine engine core 16 can include a compressor section 22 having LP and HP compressor(s) 24, 26, a combustion section 28, a turbine section 29 having LP and HP turbine(s) 30, 32, and exhaust section 34 in axial flow arrangement, An inner cowl 18, sometimes referred to as a shroud, radially surrounds the turbine engine core 16.

A HP shaft or spool 36 is disposed coaxially about the centerline 12 of the engine 10 drivingly connects the HP turbine 32 to the HP compressor 26. A LP shaft or spool 38, is disposed coaxially about the centerline 12 of the engine 10 within the larger diameter annular HP spool 36, drivingly connects the LP turbine 30 to the LP compressor 24. The shafts or spools 36, 38 are rotatable about the engine centerline and couple to a plurality of rotatable blades or elements, which can collectively define and hereinafter be referred to as the engine rotor elements 40. While the description contemplates a two-spool design, a three-spool design would be equally feasible without limiting the scope of the disclosure.

A nacelle 20 surrounds the engine 10 including the inner core cowl 18. In this manner, the nacelle 20 forms an outer cowl 42 radially surrounding the inner core cowl 18. The outer cowl 42 is spaced from the inner cowl 18 to form an annular passage 44 between the inner core cowl 18 and the outer cowl 42. The annular passage 44 can be a bypass duct, permitting a portion an airflow along the flow path 14 to bypass the turbine engine core 16. The annular passage 44 characterizes and forms a generally forward-to-aft bypass airflow path. The annular passage 44 can be thought about in two halves, an upper bifurication half or area 45 and a lower bifurcation half or area 47.

Fan assembly 17 generally has a plurality of fan blades 54 coupled to a spinner 56 in a spaced apart manner. The fan blades 54 extend outwardly from the spinner 56 in a generally radial direction. Each fan blade 54 is rotatable relative to the spinner 56 about the longitudinal axis 12 via a fan shaft 58 that is driven by the LP spool 38 via a power gearbox 60. The power gearbox 60 includes a plurality of gears for adjusting the rotational speed of the fan shaft 58 and thus the fan 52 relative to the LP spool 38. Due to the configuration of the LP spool being encompassed by the HP spool, the power gear box 60 is also operable coupled to the HP spool. Thus, rotating the fan blades 54 by turning spinner 56 will inherently turn one or both the HP spool 36 and LP spool 38 due to connection of gears in power gearbox 60.

Figure 2:
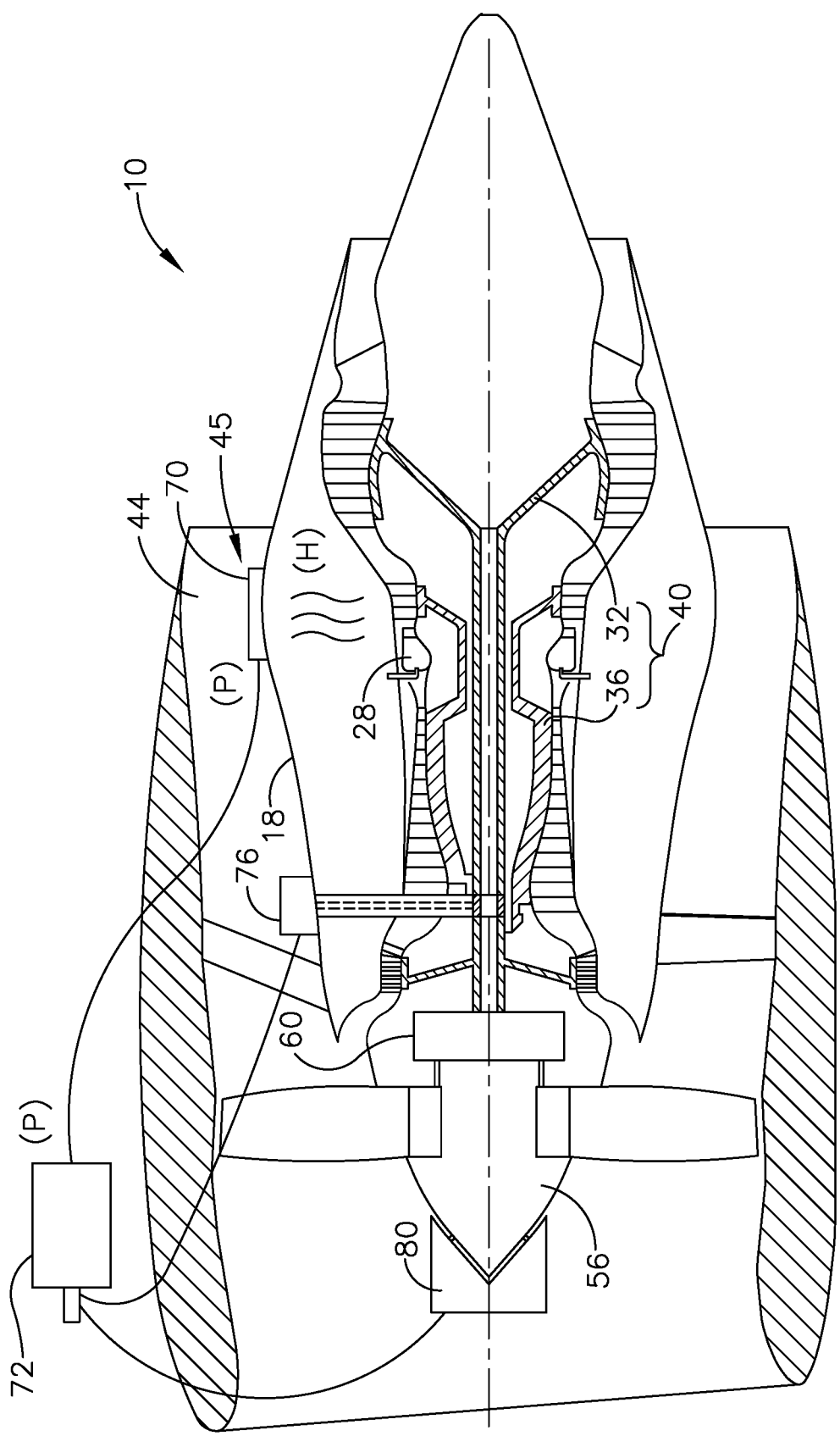
FIG. 2 is a schematic cross-sectional diagram of the turbine engine of FIG. 1 further including an engine rotor element turning device.

FIG. 2 depicts cross-sectional diagram of the turbine engine 10 of FIG. 1 implementing the present disclosure. Since cooling an engine 10 after operation can pose unique thermal management challenges with respect to bowing or warping of engine rotor blades or elements 40, a rotary driver 72 such as an electric motor can be provided to turn the engine rotor blades or elements 40 after operation of the engine 10 has been shut down. The rotary driver 72 can be integrated with the turbine engine 10 or can be a separate unit from the engine and removably mounted to directly or indirectly engage and rotate one or both of the HP spool 36 or LP spool 38. In one example, rotary driver 72 can be provided to rotate the drive spools 36, 38 through an accessory gearbox 76. The accessory gearbox 76 is well known in the art and operably couples to drive spools 36, 38 to drive components on the aircraft. Operably coupling rotary driver 72 to accessory gearbox 76 indirectly connects rotary driver 72 to drive spools 36, 38, thereby providing rotational movement to drive spools 36, 38 and engine rotor elements 40. In another example, the rotary driver 72 can be operably coupled to a device, such as a friction driver 80, removably attachable to spinner 56. The friction device 80 can frictionally couple to and cause rotation of spinner 56 by rotary driver 72. Rotation of spinner 56 causes rotation of drive spools 36, 38 via power gearbox 60.

The rotary driver 72 can be configured to receive power (P) from any suitable power source, but in an exemplary embodiment, the rotary driver 72 receives power from a thermoelectric generator 70. The thermoelectric generator 70 can be secured or removably connected to the turbine engine 10 to aid in the dissipation of heat and creation of electricity to power rotary driver 72. The thermoelectric generator 70 can be mounted in the upper bifurcation area 45 of the annular passage 44, which generally positions the thermoelectric generator 70 above the turbine engine 10. More specifically, the thermoelectric generator can be mounted above the engine combustor section 28 to maximize its exposure to heat (H) radiating from the turbine engine 10. In this specific illustration, thermoelectric generator 70 can confront and be secured to the inner core cowl 18 in the annular passage 44 above the engine combustor section 28.

It should be recognized that maximizing the thermoelectric generator's 70 exposure to heat is beneficial and a turbine engine 10 has many functional and operation parts, hoses, valves and other fittings configured to transfer and remove heat throughout the engine 10. For example, the engine combustor section 28 is typically in thermal communication with a combustion discharge pressure (CDP) valve. A CDP valve is typically located in the engine core 16 forward of the combustion section 28 under the core cowl 18. Opening the CDP valve, directing heat from the value to the thermoelectric generator, or positioning the thermoelectric generator 70 above such a valve may help increase the thermoelectric generator's 70 exposure to heat. In other words, it is within the scope of this disclosure to position the thermoelectric generator 70 or direct heat to the thermoelectric generator 70 to maximize its exposure to heat.

Figure 3:
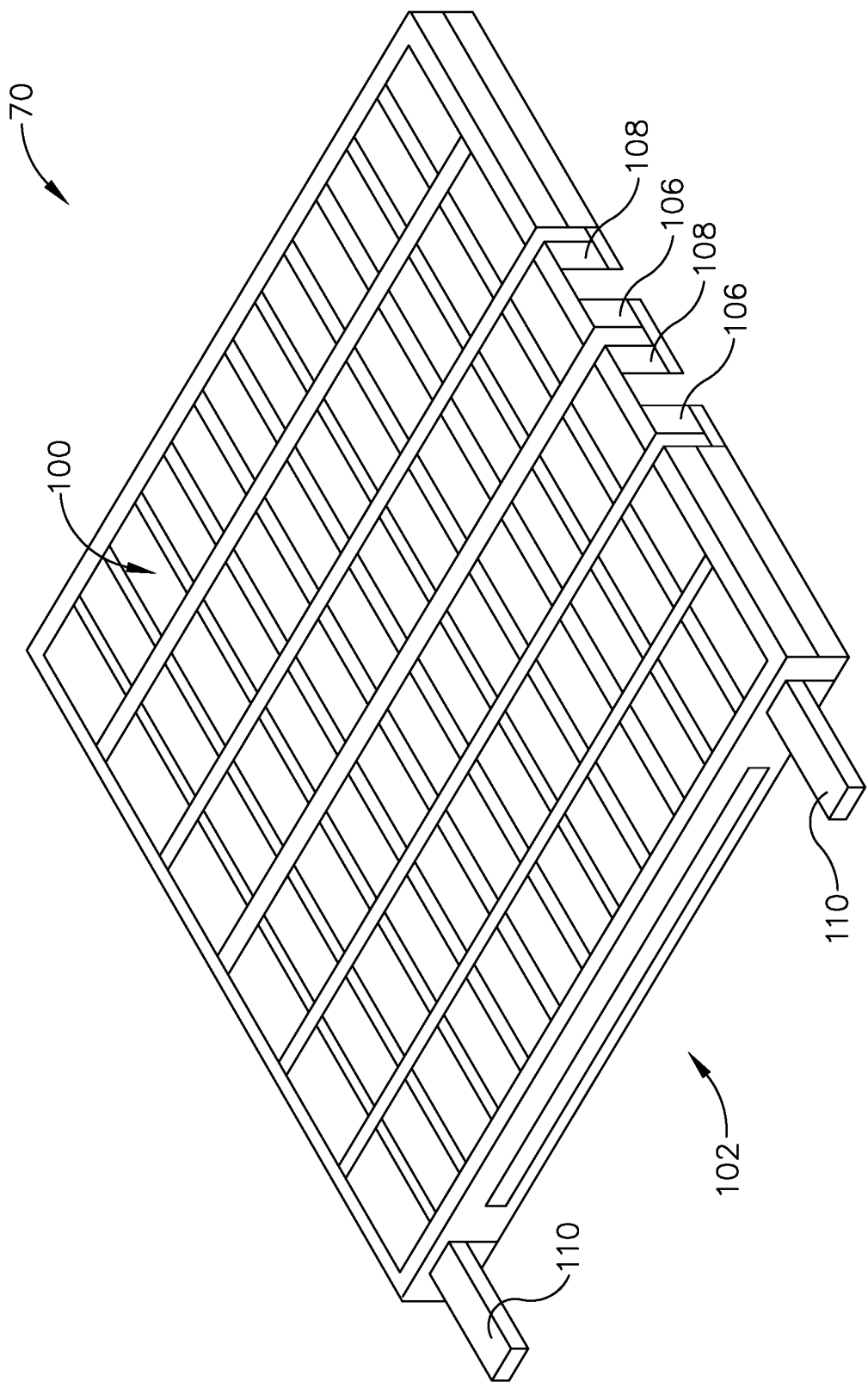
FIG. 3 is a perspective view of a thermoelectric generator for powering an engine rotor element turning device.

FIG. 3 illustrates an exemplary thermoelectric generator 70. Thermoelectric generators 70 are generally known in the art, an example being Power Generating Thermoelectric Modules sold by Hi-Z Technology. Generally, the thermoelectric generator 70 can create voltage from a temperature difference between two thermoelectric semiconductor surfaces, for simplicity, a heat absorber surface 100, and a heat rejecter surface 102. The heat absorber surface 100 is usually in thermal communication with the heat source, such as from the heat radiating from a turbine engine 10. The heat rejecter surface 102 is usually away from the heat source toward atmosphere.

Positioned between the heat absorber surface 100 and heat rejecter surface 102 can be spaced apart thermoelectric elements 104. Thermoelectic elements 104 are doped with alternating n-type 106 and p-type 108 semiconductor material. The n-type 106 and p-type 108 semiconductor materials work together to drive electron flow resulting from the temperature difference or thermal gradient between the heat absorber surface 100 and heat rejecter surface 102. The change in electron flow creates a voltage across leads 110. The current created can be DC. Thus, electricity is created by the thermoelectric generator 70.

Figure 4:
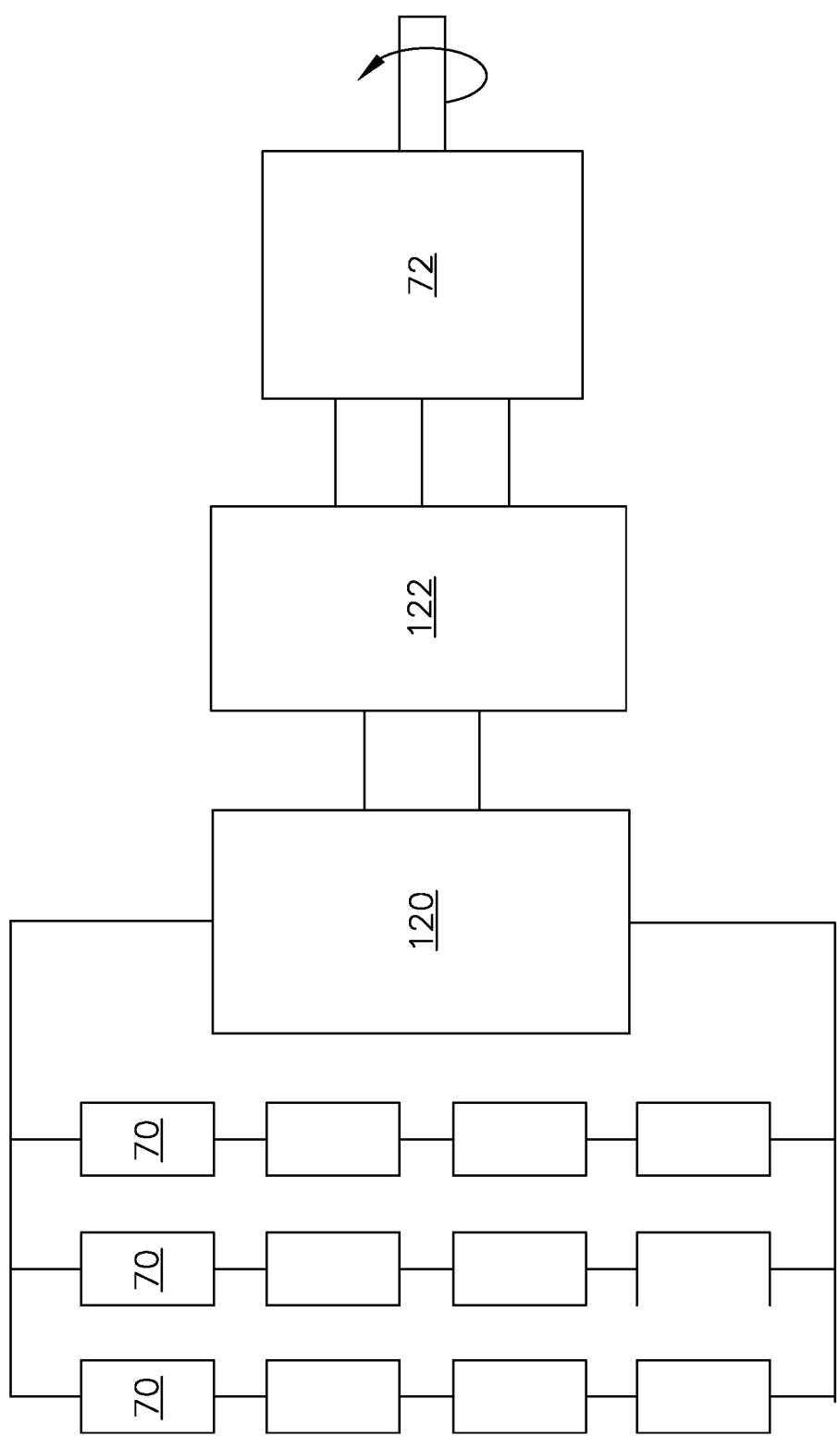
FIG. 4 is a schematic illustration of a plurality of thermoelectric generators for powering an engine rotor element turning device.

Turning to FIG. 4, a single thermoelectric generator 70 may not be sufficient to create enough power or electricity to power rotary driver 72, but a plurality of thermoelectric generators 70 connected in series and grouped in parallel can create a sufficient amount power or electricity. As illustrated, boost converter 120 (or commonly known as a step-up converter) can accumulate voltages from multiple sources such as from the plurality of thermoelectric generators 70 and convert the multiple voltages into one higher output voltage for connection to and for driving the rotary driver 72. In the illustrated example, the rotary driver 72 can be an electric motor. Typically, electric motors are driven by AC, rather than DC, so an inverter 122 may be necessary to operate the electric motor.

Figure 5:
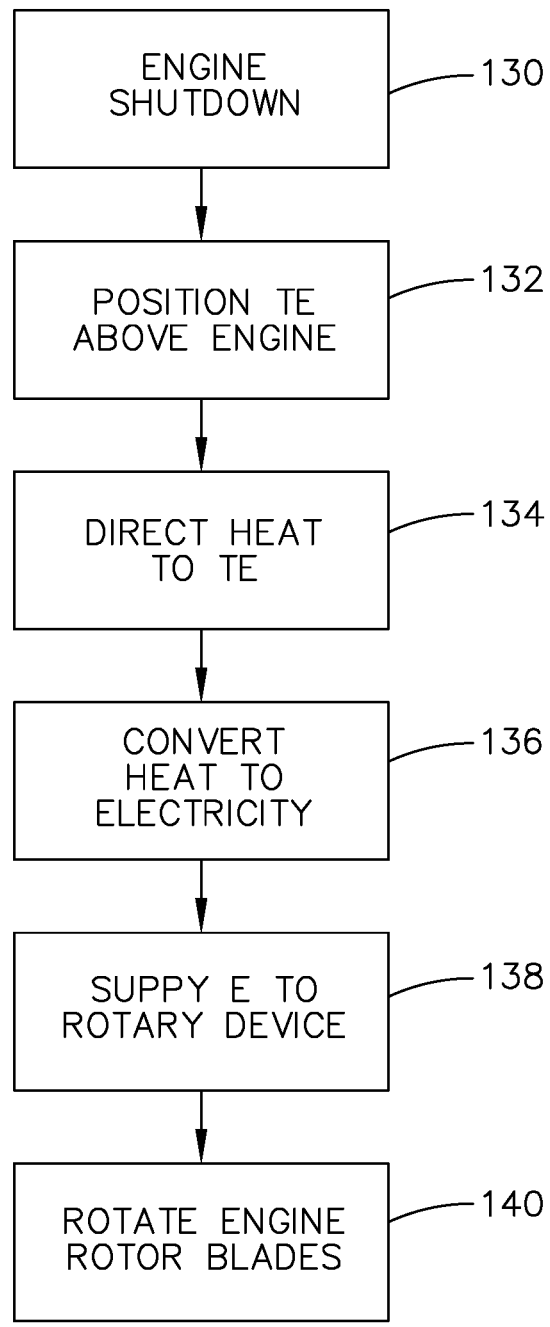
FIG. 5 is a schematic flowchart of the steps of implementing a thermoelectric generator for turning engine rotor elements.

FIG. 5 illustrates an exemplary method of turning the engine rotor elements of a turbine engine with a rotary driver. The method comprises the step of shutting down an operational and heated turbine engine, shown as step 130. The next step is positioning a thermoelectric generator above the engine combustion chamber, shown as step 132. In a non-limiting example, the thermoelectric generator can be positioned in the upper bifurcation area and secured to the inner core cowl. Next, heat from the engine can be directed to the thermoelectric generator, as indicated as step 134. The thermoelectric generator then converts the heat from the engine combustion chamber into electricity, as shown by step 136. Next, the converted electricity is supplied to power and turn a rotary driver, shown as step 138. The final step, step 140, the rotational energy from the rotary driver is transferred to an accessory gear box or spinner operably coupled to turn the engine rotor elements. In a non-limiting example, the engine rotor elements are turned in a range of about 1-5 RPM.

It should be appreciated that application of the disclosed design is not limited to turbine engines, but is applicable to turbojets and turbo engines as well. Benefits of aspects described herein can include a mechanism for implementing uniform cooling of rotor elements when an engine that has been in operation is shut off. The uniform cooling helps prevent bowed or warped rotor elements. The mechanism provides a power solution for turning an engine rotor without the need to carry additional battery weight.

To the extent not already described, the different features and structures of the various embodiments can be used in combination with each other as desired. That one feature is not illustrated in all of the embodiments is not meant to be construed that it cannot be, but is done for brevity of description. Thus, the various features of the different embodiments can be mixed and matched as desired to form new embodiments, whether or not the new embodiments are expressly described. All combinations or permutations of features described herein are covered by this disclosure.

It should be appreciated that application of the disclosed design is not limited to turbine engines with fan and booster sections, but is applicable to turbojets and turbo engines as well.

This written description uses examples to describe aspects of the disclosure described herein, including the best mode, and also to enable any person skilled in the art to practice aspects of the disclosure, including making and using any devices or systems and performing any incorporated methods. The patentable scope of aspects of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A turbine engine comprising;
   a core having compressor, combustor, and turbine sections in axial flow arrangement, with corresponding rotating elements, including a spinner mounted to a shaft to define engine rotor elements;
   a rotary driver including a friction driver attached to and turning the spinner of the engine rotor elements; and
   at least one thermoelectric generator in thermal communication with the core and in electrical communication with the rotary driver to provide power to the rotary driver to turn the engine rotor elements.

2. The turbine engine of claim 1 further comprising an inner core cowl surrounding the core, and the at least one thermoelectric generator is secured to the inner core cowl.

3. The turbine engine of claim 2 wherein the inner core cowl further comprises an upper bifurcation area and the at least one thermoelectric generator is secured in the upper bifurcation area.

4. The turbine engine of claim 3 wherein the at least one thermoelectric generator is removably secured in the upper bifurcation area of the inner core cowl.

5. The turbine engine of claim 1 further comprising an accessory gear box operably coupled to the shaft, and the rotary driver connects to and drives the accessory gear box to rotate the shaft.

6. The turbine engine of claim 1 further comprising a fan wherein the rotary driver connects to and drives the fan operably connected to the engine rotor elements.

7. The turbine engine of claim 1 wherein the at least one thermoelectric generator is in thermal communication with one of the combustor or turbine sections.

8. The turbine engine of claim 7 wherein the at least one thermoelectric generator is a plurality of thermoelectric generators arranged in electrical communication with a boost converter to provide output voltage sufficient to drive an electric motor.

9. A turbine engine rotation device comprising;
   a rotary driver including a friction driver attached to and turning a spinner of engine rotor elements on the turbine engine;
   at least one thermoelectric generator positioned above at least a portion of a heat source on the turbine engine and in electrical communication with the rotary driver to provide power to the rotary driver to turn the engine rotor elements.

10. The turbine engine rotation device of claim 9 further comprising an accessory gear box operably coupled to the engine rotor elements, and the rotary driver connects to and drives the accessory gear box to rotate the engine rotor elements.

11. The turbine engine rotation device of claim 9 further comprising a fan wherein the rotary driver connects to and drives the fan operably connected to the engine rotor elements.

12. The turbine engine rotation device of claim 9 wherein the at least one thermoelectric generator is in thermal communication and positioned above one of a combustor or turbine sections of the turbine engine.

13. A method of turning engine rotor elements including a spinner of a turbine engine with a rotary driver including a friction driver, the method comprising the step of converting heat from the engine into electricity and supplying the electricity to the rotary driver to power the rotary driver and the friction driver to turn the spinner of the engine rotor elements.

14. The method of claim 13 wherein converting heat from the engine into electricity comprises generating the electricity from a thermoelectric generator.

15. The method of claim 14 wherein the method further comprises the step of transferring rotational energy from the rotary driver to an accessory gear box operably coupled to engine rotor elements.

16. The method of claim 14 wherein the method further comprises the step of transferring rotational energy from the rotary driver to a fan operably coupled to engine rotor elements.

17. The method of claim 13 further comprising the step of turning the engine rotor elements after engine shutdown.

18. The method of claim 17 wherein the engine rotor elements are turned in a range of about 1-5 RPM.

19. The method of claim 18 further comprising the step of securing at least one thermoelectric generator to an inner core cowl of the turbine engine.

20. The method of claim 19 further comprising the step of positioning the at least one thermoelectric generator to an upper bifurcation area of the inner core cowl.

* * * * *